United States Patent
Zeller

(10) Patent No.: US 11,280,870 B2
(45) Date of Patent: Mar. 22, 2022

(54) CORRECTION METHOD AND SYSTEM FOR SLICE MULTIPLEXING ECHO PLANAR IMAGING METHODS

(71) Applicant: Siemens Healthcare GmbH, Erlangen (DE)

(72) Inventor: Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/584,839

(22) Filed: Sep. 26, 2019

(65) Prior Publication Data

US 2020/0103484 A1   Apr. 2, 2020

(30) Foreign Application Priority Data

Sep. 28, 2018   (DE) .......................... 102018216774.5

(51) Int. Cl.
   *G01V 3/00*     (2006.01)
   *G01R 33/565*   (2006.01)

(52) U.S. Cl.
   CPC ............... *G01R 33/56554* (2013.01)

(58) Field of Classification Search
   CPC .......... G01R 33/543; G01R 33/5659; G01R 33/3415; G01R 33/36; A61B 5/055
   USPC ....................................................... 324/309
   See application file for complete search history.

(56) References Cited

U.S. PATENT DOCUMENTS

| | | | |
|---|---|---|---|
| 5,185,574 A * | 2/1993 | Ehman ................. | G01R 33/446 324/307 |
| 6,043,651 A | 3/2000 | Heid | |
| 9,329,254 B2 | 5/2016 | Pfeuffer | |
| 2012/0249138 A1 | 10/2012 | Pfeuffer | |
| 2015/0025337 A1 * | 1/2015 | Choi ....................... | A61B 8/543 600/301 |
| 2015/0115958 A1 * | 4/2015 | Wang .................. | G01R 33/4835 324/309 |
| 2016/0041248 A1 | 2/2016 | Chen et al. | |
| 2017/0089999 A1 * | 3/2017 | Zeller .............. | G01R 33/56563 |
| 2018/0095150 A1 | 4/2018 | Zeller | |

(Continued)

FOREIGN PATENT DOCUMENTS

DE   102016218955 A1   4/2018

OTHER PUBLICATIONS

J. Pfeuffer et al: "Dynamic Phase Echo-Planar Imaging—Detection and Correction of Dynamic Off-Resonance", ISMRM abstract 2011; 2011.

(Continued)

*Primary Examiner* — Walter L Lindsay, Jr.
*Assistant Examiner* — Frederick Wenderoth
(74) *Attorney, Agent, or Firm* — Schiff Hardin LLP

(57) ABSTRACT

In a method for simultaneous generation of measurement data of at least two subvolumes of an examination object by means of a slice multiplexing EPI-method, after an RF excitation pulse, at least three navigator signals, but a total of at least one navigator signal per possible polarity and per subvolume to be simultaneously recorded, are recorded in the absence of phase encoding gradients. From the recorded navigator signals, subvolume-specific correction data is determined, which can be used in a reconstruction of image data from acquired raw data for correcting shifts caused by phase errors in the MR raw data.

17 Claims, 5 Drawing Sheets

(56) References Cited

U.S. PATENT DOCUMENTS

2018/0348323 A1  12/2018  Carinci et al.

OTHER PUBLICATIONS

Setsompop, Kawin et al. "Improving diffusion MRI using simultaneous multi-slice echo planar imaging" NeuroImage, vol. 63, pp. 569-580, 2012.
Breuer, Felix A. et al. "Controlled Aliasing In Parallel Imaging Results in Higher Acceleration (CAIPIRINHA) for Multi-Slice Imaging" Magnetic Resonance in Medicine; vol. 53; pp. 684-691; 2005.
Setsompop, Kawin et al. "Blipped-Controlled Aliasing in Parallel Imaging for Simultaneous Multislice Echo Planar Imaging With Reduced g-Factor Penalty" Magnetic Resonance in Medicine; vol. 67; No. 5; pp. 1210-1224; DOI 10.1002/mrm.23097.; 2012.; 2012.
Zahneisen, Benjamin et al. "Three-Dimensional Fourier Encoding of Simultaneously Excited Slices: Generalized Acquisition and Reconstruction Framework", in: Magnetic Resonance in Medicine, (2014), vol. 71, pp. 2071-2081; 2014.
German Office Action dated Jun. 25, 2019, for Application No. 10 2018 216 774.5.

* cited by examiner

CORRECTION METHOD AND SYSTEM FOR SLICE MULTIPLEXING ECHO PLANAR IMAGING METHODS

CROSS REFERENCE TO RELATED APPLICATIONS

This patent application claims priority to German Patent Application No. 102018216774.5, filed Sep. 28, 2018, which is incorporated herein by reference in its entirety.

BACKGROUND

Field

The disclosure relates to a correction method and system for slice multiplexing EPI methods with which a phase correction for correction of shifts in image data can be carried out.

Related Art

The magnetic resonance technique (hereinafter the abbreviation MR stands for magnetic resonance) is a known technique with which images of the inside of an examination object can be generated. In simple terms, the examination object is positioned in a magnetic resonance device in a comparatively strong static, homogeneous base magnetic field, also called a $B_0$ field, having field strengths of 0.2 tesla to 7 tesla and more so its nuclear spins orient themselves along the base magnetic field. For triggering nuclear spin resonances, radio frequency excitation pulses (RF pulses) are irradiated into the examination object, the triggered nuclear spin resonances are measured as what is known as k-space data and MR images are reconstructed or spectroscopic data is determined on the basis thereof. For spatial encoding of the measurement data, fast-switched magnetic gradient fields are superimposed on the base magnetic field. The recorded measurement data is digitized and stored as complex numerical values in a k-space matrix. From the k-space matrix filled with values, an associated MR image can be reconstructed, for example by means of a multi-dimensional Fourier transform.

In order to improve the signal-to-noise ratio (SNR) for MR measurements or to reduce the sensitivity of the measurement to movement or flux, it is customary for many recordings to record measurement data multiple times in order to be able to average the measurement data or, for example, the reconstructed image data.

One of the fastest known MR recording techniques is echo planar imaging (EPI), in which, after an RF excitation pulse, an oscillating, in other words bipolar, readout gradient is used, which refocuses the transverse magnetization every time the direction of polarization of the gradient is changed until it allows the T2* decay and thereby generates a gradient echo. In other words, by switching the bipolar readout gradient after an RF excitation pulse within the free induction drop after the excitation (FID), or if an RF refocusing pulse is additionally irradiated after the RF excitation pulse, within the thus-generated spin echo, an echo train of increasing and decreasing gradient echoes with changing signs is generated. EPI pulse sequences can be used as what is known as the "single-shot" method, in which all measurement data for the generation of an image of a subvolume, for example a slice, of the investigated examination object is recorded after just one RF excitation pulse.

Because of the changing polarity of the readout gradient, the measurement data obtained from the gradient echo signals must be sorted into a raw data k-space matrix in such a way that the sort direction changes from line to line of the raw data k space matrix. If there are even slight deviations from line to line, for example due to delays in the gradient switching, this leads to what is known as N/2 ghosts, in other words in the case of an image matrix of N×N points, the actual image is mapped again shifted by N/2 in the positive and negative directions with respect to the image matrix center, and, more precisely, generally with different intensity. For the correction of such N/2-ghosts it is known, for example from the U.S. Pat. No. 6,043,651, to record three navigator signals by switching a bipolar readout gradient with which a correction of phase shifts of the zero and first orders between gradient echoes recorded with different polarity can be carried out in the readout direction, which can correct shifts of this kind. For this purpose, a correlation of the recorded navigator signals in the image space is used to determine correction factors, which are used in a reconstruction of image data from gradient echoes recorded as the measurement data in a raw data k-space matrix to correct the shifts in the raw data k-space matrix.

A further phase correction method, called DORK, for correcting shifts caused by temporal variations of a base magnetic field applied during an EPI measurement, for example a drift, in which a navigator signal is recorded, is known for example from U.S. Pat. No. 9,329,254B2. In this process, an evolution of the gradient echoes, which were recorded with one polarity, is compared with an evolution of the gradient echoes, which were recorded with the other polarity, across successive recordings of raw data k-space matrices. Usually, with such a DORK correction, an entire image volume is averaged.

FIG. 1 shows a schematic pulse sequence diagram which illustrates the temporal sequence of RF pulses and generated echoes (RF) in relation to the gradients to be switched in the readout direction (GR) and phase encoding direction (GP) of an EPI pulse sequence with generation and recording of navigator signals, which can be used for the above-described correction methods. A representation of the gradients to be switched in the slice direction has been omitted. In the example shown, after an RF excitation pulse RF-A in a navigator block NB, by switching bipolar readout gradients (GR), three navigator signals N1, N2, N3 are generated as gradient echoes after an RF excitation pulse RF-A. No gradients are switched in the phase encoding direction (GP), in the navigator block NB, in other words during the generation and reading out of the navigator signals N1, N2, N3. Only after recording of the navigator signals N1, N2, N3 does the generation and recording of measurement signals E1, E2, E3, E4, . . . begin for imaging according to an EPI technique (EPI). In the example shown, only one RF excitation pulse RF-A is shown in the excitation block A. However, a plurality of RF pulses can also be irradiated in the excitation block A, for example also at least one RF refocusing pulse.

The desire for ever faster MR images in the clinical environment is currently leading to a renaissance of methods in which a plurality of images are recorded simultaneously. In general, these methods can be characterized by the fact that, at least during part of the measurement, targeted transverse magnetization of at least two slices is used simultaneously for the imaging process ("multi-slice imaging", "slice multiplexing"). In contrast, in the established "multi-slice imaging" the signal of at least two slices is recorded alternately, in other words completely independently of each other with a correspondingly longer measuring time.

Known methods for this are, for example, what is known as Hadamard encoding, methods with simultaneous echo refocusing, methods with broadband data acquisition or also methods that use parallel imaging in the slice direction. The latter methods include, for example, the CAIPIRINHA technique, as developed by Breuer et al. in "Controlled Aliasing in Parallel Imaging Results in Higher Acceleration (CAIPIRINHA) for Multi-Slice Imaging", Magnetic Resonance in Medicine 53, 2005, p. 684-691, and the blipped CAIPIRINHA technique as described by Setsompop et al. in "Blipped-Controlled Aliasing in Parallel Imaging for Simultaneous Multislice Echo Planar Imaging With Reduced g-Factor Penalty", Magnetic Resonance in Medicine 67, 2012, pp. 1210-1224.

In particular in the latter slice multiplexing methods, what is known as a multi-band RF pulse is used to excite two or more slices simultaneously or to manipulate them in some other way, for example to refocus or saturate. Such a multi-band RF pulse is, for example, a multiplex of individual RF pulses, which would be used to manipulate the individual slices to be manipulated simultaneously. Multiplexing results, for example, in a base band-modulated multi-band RF pulse from an addition of the pulse shapes of the individual RF pulses. The spatial encoding of the recorded signals is achieved substantially by a common gradient circuit in two directions (two-dimensional gradient encoding).

The resulting signals are recorded from all excited slices collapsed in a data set by means of a plurality of receiving antennas and then separated with the aid of parallel acquisition techniques according to the individual slices.

The parallel acquisition techniques (ppa techniques), with the aid of which acquisition times already generally necessary for recording the desired data may be reduced by a, according to Nyquist, incomplete, in other words sub-sampling of the k-space, include, for example, GRAPPA ("GeneRalized Autocalibrating Partially ParallelAcquisition") and SENSE ("SENSitivity Encoding"). The measuring points in the k-space, which are not measured in the context of sub-sampling are generally uniformly distributed over the k-space to be measured according to Nyquist, so, for example, every second k-space line is measured. Furthermore, the "missing" k-space data is reconstructed with parallel acquisition techniques with the aid of coil sensitivity data. This coil sensitivity data of the receiving coils used in the recording of the measurement data is determined from reference measurement data, which samples at least one region of the k-space to be measured, usually the central region, completely according to the Nyquist condition.

In slice multiplexing methods, parallel acquisition techniques are used to separate the measurement data simultaneously recorded for different slices. Reference measurement data for all affected slices has to be recorded here. This is usually done in the context of an additional reference measurement to be carried out, which measures reference measurement data individually for each desired slice.

In order to be able to separate the resulting signals of the different slices, for example, one different phase each is impressed on the individual RF pulses before multiplexing, for example by adding a phase that increases linearly (for example with the k-space coordinate in the phase encoding direction ($k_y$)). Therefore, a different phase increase can be impressed on each slice, whereby the slices are shifted towards each other in the image space. This shift is controlled by what is known as the "FOV (field of view) shift factor". How an optimal FOV shift factor can be determined is described, for example, in post-published DE102016218955.

In CaiPIRINHA methods described in the above-mentioned articles by Breuer et al. and Setsompop et al., changing further phase shifts, which generate shifts in the image space in the shift direction ("interslice FoV shifts"), are impressed between the simultaneously excited slices by switching additional gradient blips or by additional modulation of the phases of the RF pulses of the multi-band RF pulses. These additional shifts in the image space improve the quality of the separation of the signals of the slices, in particular when the coil sensitivities exhibit such small differences in the sensitivity profiles of the individual coils used that these are not sufficient for reliable separation of the slices. Therefore, artifacts are reduced in the image data that is ultimately reconstructed from the measured measurement data.

The effect of the additional phase shifts on the sampling pattern of a two-dimensional (2D) slice multiplexing measurement can be described as follows: by way of the additional phases which are impressed in slice multiplexing CAIPIRNHA method, the measuring points loaded with the additional phase are shifted by a shift in the k-space in the kz direction. The size of this shift in the kz direction depends on the phase that has been impressed. This is also described, for example, in the Article by Zahneisen et al.: "Three-Dimensional Fourier Encoding of Simultaneously Excited Slices: Generalized Acquisition and Reconstruction Framework", Magn. Reson. Med. 71, p. 2071-2081 (2014).

The reference measurement data, from which sensitivity data is obtained for the separation of the simultaneously recorded slices and/or for the supplementation of missing measurement data, has previously had to be additionally measured for each SMS measurement. The additional recording of the reference measurement data increases the recording time required overall and the SAR load (SAR: "Specific Absorption Rate") when using a slice multiplexing method and therefore reduces the advantages of a reduced measuring time and SAR load, which are actually desired in these methods.

The article by Setsompop et al., "Improving diffusion MRI using simultaneous multi-slice echo planar imaging", NeuroImage 63:569-580, 2012, describes a simultaneous multi-slice EPI method in which slice-specific reference data is recorded separately for each slice in order to be able to separate the measurement data that has been collapsed for a plurality of slices into measurement data of the individual slices. Furthermore, it is already described here that, in principle, navigator measurements can also be carried out simultaneously for a plurality of slices, although this can also be in collapsed form for the relevant slices. However, since navigator signals for correcting N/2 ghosts must be recorded without phase encoding gradients, and there is no known way to separate collapsed recorded, non-phase-encoded measurement data, such navigator data simultaneously recorded for a plurality of slices is not suitable for a correction of N/2 ghosts described above, but can be used for a non-slice-specific correction averaged over the imaging volume, according to a DORK method. To correct N/2 ghosts, navigator data must be acquired for each slice. Slice-specific navigator data could be obtained, for example, from a separately recorded slice-specific measurement of reference data. However, this can lead to strong artifacts if the measurement conditions of the measurement data recorded for imaging change with respect to the measurement conditions for recording of the reference data, for example due to eddy current variations or due to movements of the examination object.

From US20170089999A1 a method is known, in which two sets of phase-encoded navigator signals with opposing polarity and equal strength are recorded in successive measurement in order to determine therefrom with the aid of recorded reference data, non-phase-encoded navigator signals (assigned to the central k-space line in the phase encoding direction), which are suitable for correcting N/2 ghosts. However, the achievable temporal resolution is reduced here by the necessary repeated recording of phase-encoded navigator signals. Furthermore, the required number of navigator signals corresponds at least to the reference data recorded in the phase encoding direction. However, the measuring time for the navigator signals should be kept as short as possible in order to keep the total measuring time low.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
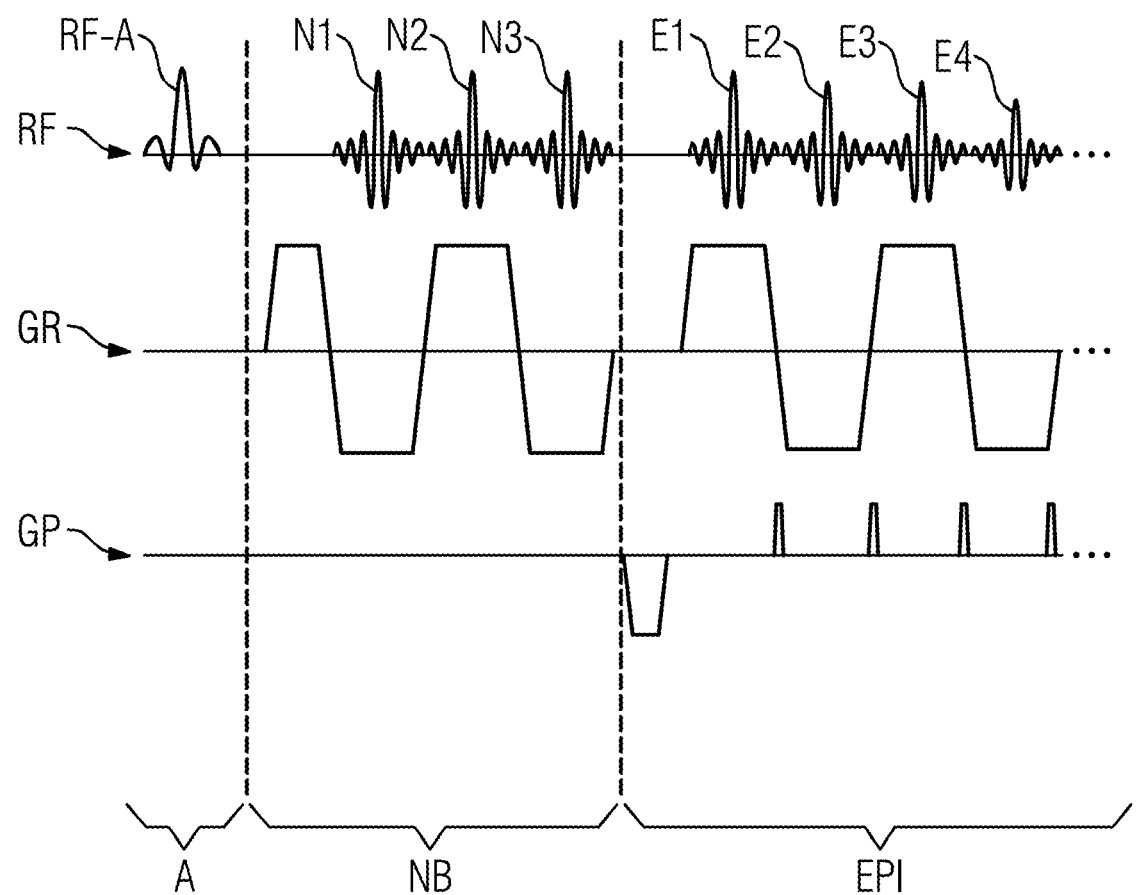
FIG. 1 shows an example EPI-like pulse sequence diagram with recording of navigator signals.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

An object of the present disclosure is to accelerate the correction of phase errors in EPI recordings of MR data using a slice-multiplexing method, for example, for the correction of N/2 ghosts, efficiently, subvolume-specifically and with a high temporal resolution.

In an exemplary embodiment, a method for generating measurement data of an examination object uses a magnetic response technique. In an exemplary embodiment, the method includes: after an RF excitation pulse, a train of a plurality of echo signals in a number N, where N is at least two, of different subvolumes of the examination object is generated, and by switching gradients with changing polarity, is recorded for successive echo signals. In an exemplary embodiment, one each of the likewise N different phases is impressed on successive echo signals, and recorded echo signals of the at least two subvolumes are acquired as MR raw data in a raw data set (RDS).

In an exemplary embodiment, after an RF excitation pulse, at least three navigator signals, but a total of at least one navigator signal per possible polarity and per different phase to be impressed, are recorded in the absence of phase encoding gradients, from which subvolume-specific correction data is determined, which can be used in a reconstruction of image data from acquired raw data for correcting shifts caused by phase errors in the MR raw data.

In an exemplary embodiment, the method is in the form of a slice-multiplexing EPI method, and allows subvolume-specific correction data for the correction of shifts caused by phase errors in the MR raw data without the need to record reference data, which is required for a separation of collapsed recorded measurement data of various sub-volumes. In an exemplary embodiment, the method is a slice-GRAPPA method, such as described in the above-mentioned articles by Setsompop et al.

In an exemplary embodiment, the number of navigator signals to be recorded is independent of a size of a reference data set used for the multi-slice reconstruction in the phase encoding direction.

In an exemplary embodiment, the navigator signals can be recorded by switching gradients with changing polarity for successive echo signals, and the polarity which has the associated readout gradient is assigned to each navigator signal. In particular, a readout gradient similar to a bipolar readout gradient used for the echo signals can be used for the navigator signals. This is also the case, for example, in the example shown in FIG. 1, in which the readout gradients in the navigator block NB have the same strength as the readout gradients of the EPI train.

In an exemplary embodiment, the navigator signals is advantageously generated and recorded directly after an RF excitation pulse and before generated echo signals. This is possible without generating ghost artifacts.

In an exemplary embodiment, one each of the phases impressed on the echo signals can be impressed on the navigator signals. In this way, the collapsed navigator signals recorded for all simultaneously excited sub-volumes can be separated into subvolume-specific data respectively just like the recorded echo signals stored as MR raw data.

In an exemplary embodiment, each of the phases impressed on the echo signals is impressed on at least one navigator signal, so each of the interslice FoV shift achieved by the impressed phases is at least also achieved with one of the navigator signals.

In an exemplary embodiment, after an RF excitation pulse, an odd number of navigator signals are recorded. In this way, it is possible to compensate for the effects of off-resonance effects, which manifest themselves in different ways on the respective navigator signals due to the different echo times of the navigator signals.

In an exemplary embodiment, all navigator signals and all echo signals can be recorded after one excitation pulse. This achieves a high temporal resolution of both echo signals and navigator signals and keeps the measuring time short overall. The subvolume-specific correction data determined from the navigator signals is such that, since the navigator signals are recorded virtually under the same conditions as the echo signals, it is always particularly well matched to the MR raw data to be corrected.

As will be explained below, it is already sufficient if the number n of navigator signals recorded for the determination of the subvolume-specific correction data corresponds to double the number of simultaneously recorded subvolumes N plus one (n=2*N+1) in order to be able to remove N/2 ghosts with the correction data. The generation and recording of 2*N+1 navigator signals entails only a small extension of the pure SMS-EPI sequence, which hardly matters in comparison with the above-mentioned methods of US20170089999A1.

It is also possible to repeat the irradiation of an RF excitation pulse and switching of gradients for the generation and reading out of navigator signals and echo signals. In this case, the phases of a repetition impressed on the respective navigator signals can differ from the phases impressed on the navigator signals corresponding to the respective navigator signals in a preceding repetition. Therefore, in particular if the irradiation of an RF excitation pulse and switching of gradients for the generation and reading out of navigator signals and echo signals is repeated N times, wherein a different one of the phases is impressed on the navigator signals in particular in each repetition, in total at least three navigator signals can be recorded for each possible impressed phase. When such repetitions are used, the temporal resolution decreases with the number of repetitions. Nevertheless, a good temporal resolution is still achieved from a set of correction data per N-fold repetition time of the pulse sequence. In one embodiment with such a repetition, it is sufficient to record three navigator signals after each RF excitation pulse. Therefore it is possible to use a navigator block in which the navigator signals are recorded, which, compared to known navigator blocks, which already record three navigator signals, is not lengthened.

In an exemplary embodiment, the determination of the correction data includes a determination of an interpolated navigator signal, by interpolation (e.g. by averaging) of two recorded navigator signals, which were recorded by switching one readout gradient each of the same polarity, with the same polarity continuing to be assigned to the interpolated navigator signal. The possibilities and advantages of such an approach are described, for example, in above-mentioned U.S. Pat. No. 6,043,651.

In an exemplary embodiment, the determination of the correction data, in each case, includes a separation of navigator signals assigned to an identical polarity in subvolume-specific navigator data. In an exemplary embodiment, the separation of the collapsed recorded navigator signals can take place, for example as described in the article by Zahneisen et al., by a Fourier transform in the direction in which the subvolumes are separated. For example, if the subvolumes are slices in the examination object, a Fourier transform in the slice direction. Therefore, the data to be assigned to the individual subvolumes can be dispensed with for the separation of collapsed measured data.

In an exemplary embodiment, the magnetic resonance system includes a magnetic unit, a gradient unit, a radio frequency unit and a control device (controller) configured to perform a method according to one or more aspects. In an exemplary embodiment, the controller includes a radio frequency transceiving controller with a multi-band RF pulse unit.

An inventive computer program implements an inventive method on a control device when it is run on the control device.

The computer program can also be in the form of a computer program product here, which can be loaded directly into a memory of a control device, having program code means to carry out an inventive method when the computer program product is run in the arithmetic unit of the computer system.

An inventive electronically readable data carrier includes electronically readable control information stored thereon, which includes at least one inventive computer program and which is designed in such a way that it carries out an inventive method when the data carrier is used in a control device of a magnetic resonance system.

The advantages and statements disclosed in relation to the method also apply analogously to the magnetic resonance system, the computer program product and the electronically readable data carrier.

Figure 2:
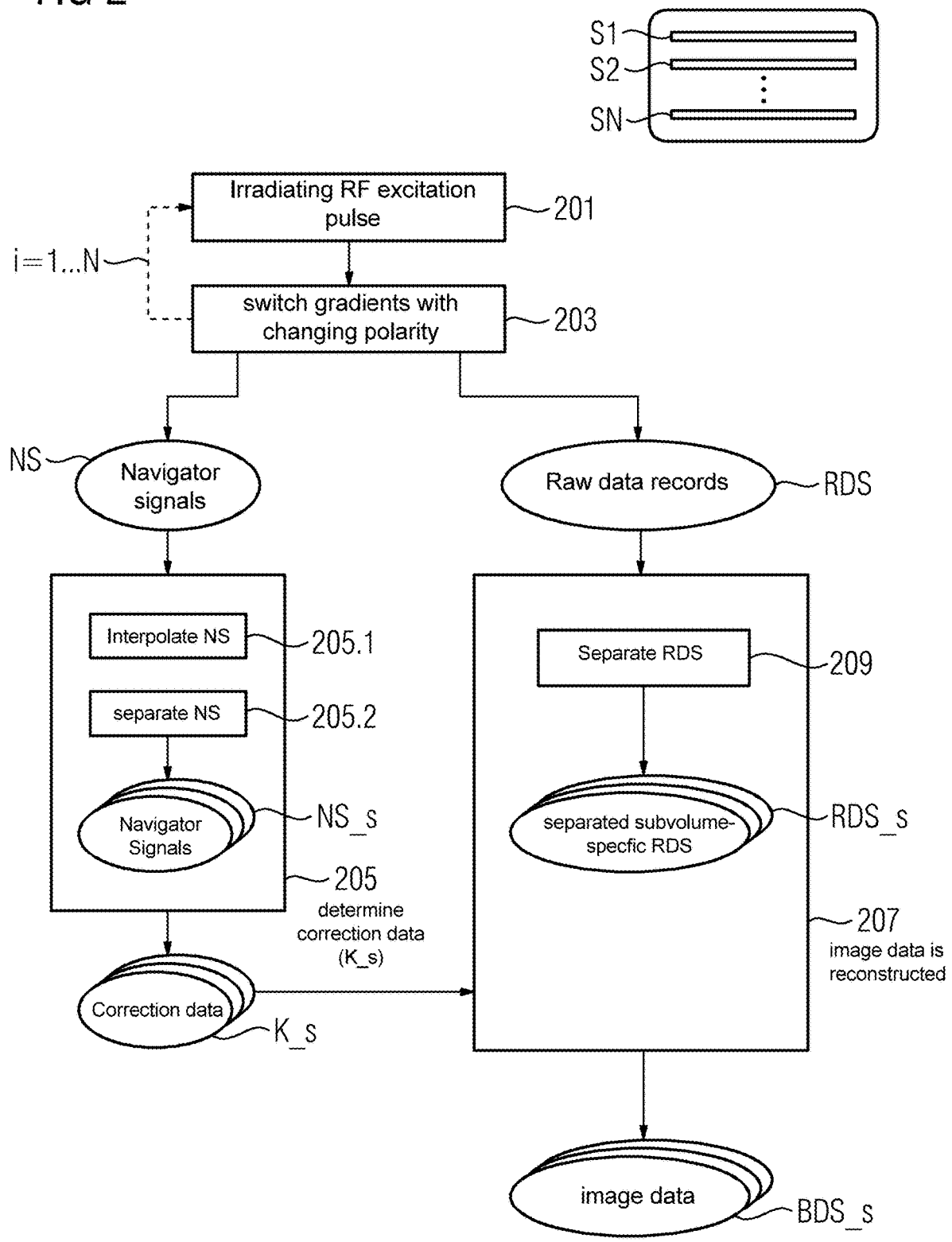
FIG. 2 is a flowchart of a correction method according to an exemplary embodiment of the present disclosure.

FIG. 2 is a schematic flowchart diagram of a method for generating measurement data, according to an exemplary embodiment, of an examination object using a magnetic resonance technology.

An RF excitation pulse, in particular in multi-band RF excitation pulse, is irradiated into an examination object to excite spins in N, N≥2, subvolume S1, S2, . . . , SN (block 201).

Furthermore, gradients with changing polarity are switched (block 203) in order to generate together with the RF excitation pulse a train of a plurality of echo signals and to spatially encode them on their recording, with one each of likewise N different phases being impressed on successive echo signals (see later also with reference to FIGS. 3 and 4), and with recorded echo signals of the N subvolumes being acquired as MR raw data in a raw data record RDS. The switched gradients continue to generate at least three navigator signals NS after the previously irradiated RF excitation pulse, which are recorded in the absence of phase encoding gradients (block 203).

Subvolume-specific correction data K_s is determined (block 205) from the recorded navigator signals NS.

Image data BDS_s is reconstructed (block 207) from the MR raw data acquired in the raw data set RDS, with the determined subvolume-specific correction data K_s being used in the reconstruction of the image data BDS_s for the correction of shifts caused by phase errors in the MR raw data. When reconstructing the image data BDS_s from a raw data set RDS, a separation of the MR raw data of the N subvolume contained collapsed in the raw data set RDS can be separated into subvolume-specific raw data sets RDS_s (block 209). This can be done, for example, with the aid of a slice-GRAPPA method, or via a Fourier transform in a k-spatial direction as described in the above article by Zahneisen et al.

In an exemplary embodiment, the determination 205 of the correction data K_s can include determination of an interpolated navigator signal (block 205.1), by interpolation, in particular by averaging, two recorded navigator signals, which were recorded by switching one readout gradient each of the same polarity, with the same polarity continuing to be assigned to the interpolated navigator signal. More details on this will be given below with reference to FIGS. 3 and 4.

Furthermore, the determination 205 of the correction data K_s can in each case include a separation of navigator signals assigned the same polarity into subvolume-specific navigator data NS_s (block 205.2). In particular, it is possible to use the interslice FoV shifts generated by the impression of different phases in order to separate the collapsed recorded data with the aid of a Fourier transform in the direction corresponding to interslice FoV shifts into subvolume-specific measurement data without the need for reference data. More details will be given below in this regard as well with reference to FIGS. 3 and 4.

Figure 3:
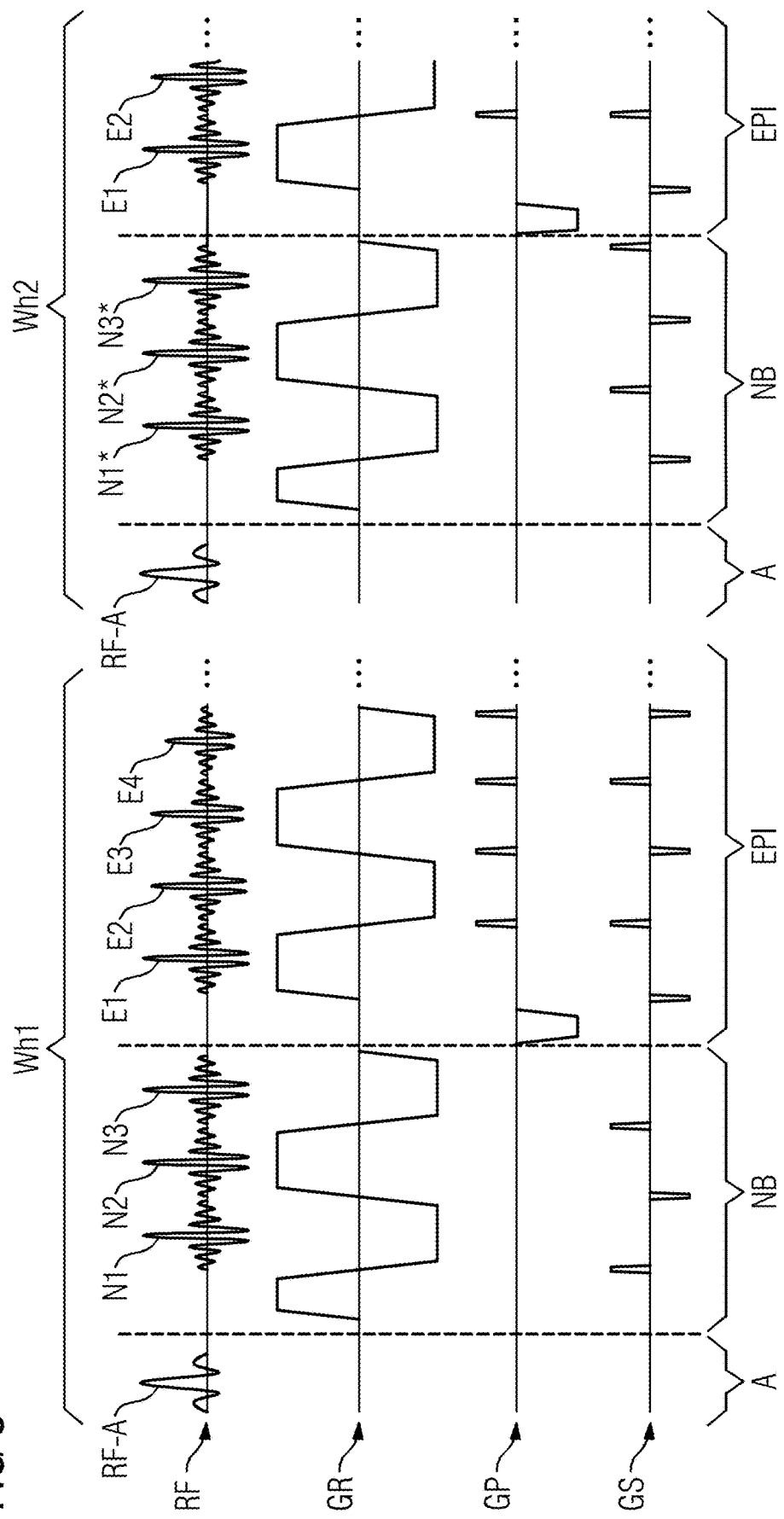
FIG. 3 is a pulse sequence diagram that illustrates a method according to an exemplary embodiment for simultaneous recording of measurement data from two slices with repeated recording of navigator signals and echo signals.

FIG. 3 shows a schematic pulse sequence diagram, according to an exemplary embodiment, to illustrate a method for simultaneously recording measurement data from two subvolumes in the form of two slices with repeated recording of navigator signals and echo signals in a repetition Wh1 and a repetition Wh2.

Except for the switching of gradient blips in the slice encoding direction GS for the impression of a phase, each of the illustrated repetitions corresponds to the pulse sequence pattern of FIG. 1. Therefore, the same reference numerals were used for basically the same elements of the pulse sequences.

The navigator signals N1, N2, N3 are recorded by switching gradients in the readout direction GR with changing polarity for successive echo signals, whereby each navigator signal N1, N2, N3 is assigned the polarity that the associated readout gradient has. In particular, the readout gradients can have the same strength as the readout gradients used during the echo signals E1, E2, E3, . . . to be read out.

Therefore, from the first repetition Wh1, two navigator signals N1 and N3 recorded with a read-out gradient of negative polarity and loaded by similar short gradient blips in the slice encoding direction with a first phase, as well as a navigator signal N2 recorded with a readout gradient of positive polarity and loaded by a short gradient blip different from the gradient blips applied to the navigator signals N1 and N3 in the slice encoding direction with a second phase.

One each of the phases that is also impressed on the echo signals E1, E2, E3, E4, . . . is advantageously impressed on the navigator signals N1, N2, N3. Therefore, the echo signals and also the navigator signals can be separated in the same way into subvolume-specific measurement data.

From the second repetition Wh2, due to the gradient blips applied in the reverse direction, two navigator signals N1* and N3* recorded with a readout gradient of negative polarity and loaded by simultaneously short gradient blips in the slice encoding direction with the second phase are obtained on the other hand, as well as a navigator signal N2* recorded with a readout gradient of positive polarity and loaded by an applied short gradient blip in the slice encoding direction with the first phase. If, as illustrated, the aim is to keep distribution of the impressed phases for the echo signals E1, E2, . . . the same in the different repetitions, after recording the last navigator signal in a navigator block NB, for example after the navigator signal N3*, a further gradient blip can be inserted in the slice encoding direction to keep the zeroth moment of the gradient blips in the slice encoding direction at zero overall.

In an exemplary embodiment, each of the phases impressed on the echo signals is therefore impressed on at least one navigator signal. If the navigator signals N1, N2, N3, N1*, N2* and N3* recorded during the course of the repetitions Wh1 and Wh2 are combined, three navigator signals each are obtained for each impressed phase. In the example shown, these are the navigator signals N1, N2* and N3 for the first impressed phase, and the navigator signals N1*, N2, N3* for the second impressed phase. The collapsed navigator signals N1, N2, N3, N1*, N2* and N3* for the two simultaneously recorded slices can now be separated, for example, by means of a Fourier transform in the kz direction, into three slice-specific navigator data for each slice. These slice-specific navigator signals can now be used separately for each slice, in order, for example by means of at least one of the above-mentioned methods for correcting N/2 ghosts and a DORK method, to determine slice-specific correction data.

The irradiation of an RF excitation pulse and switching of gradients for the generation and reading out of navigator signals and echo signals can therefore be repeated. If the phases of a repetition, impressed on the respective navigator signals, differ from phases impressed in a preceding repetition on navigator signals corresponding to the respective navigator signals, a set of navigator signals can be quickly generated, which includes at least one navigator signal for each polarity and for each phase to be impressed. In order to achieve this particularly purposefully, the irradiation of an RF excitation pulse and switching of gradients for the generation and reading out of navigator signals and echo signals can be repeated N times in such a way that a different one of the phases is impressed on the navigator signals in each of the N repetitions.

In an exemplary embodiment, the procedure can be similar with simultaneous recording of more than two subvolumes in that the number of repetitions matches the number of simultaneously recorded subvolumes, and each of the three navigator signals recorded in each repetition is impressed in each repetition with another of the number of different phases matching the number of simultaneously recorded subvolumes. For example, with a simultaneous recording of measurement data from three slices in a first repetition, a first phase can be impressed on a first navigator signal, a second phase on a second navigator signal and a third phase on a third navigator signal. In the second repetition, the second phase could now be impressed on the first navigator signal, the third phase on the second navigator signal and the first phase on the third navigator signal. In the third repetition, the third phase could be impressed on the first navigator signal, the first phase on the second navigator signal and the second phase on the third navigator signal. Therefore, all three navigator signals would again have been loaded once each with one of the possible phases, whereby a combination of the total recorded navigator signals can be separated again by means of Fourier transform in the kz direction into slice-specific navigator data.

Figure 4:
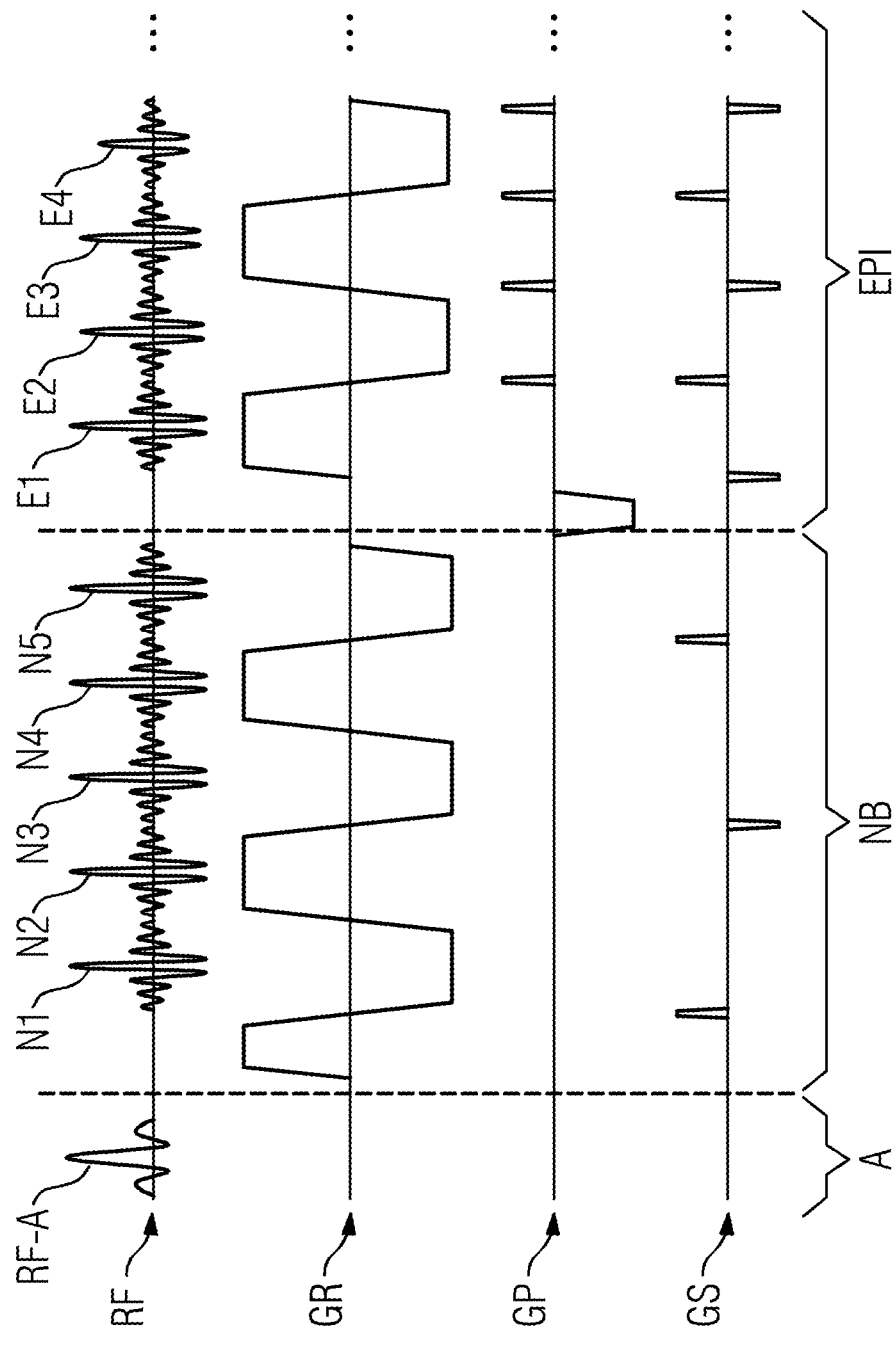
FIG. 4 is a pulse sequence diagram that illustrates a method according to an exemplary embodiment for recording navigator signals with simultaneous recording of measurement data from two slices in only one repetition.

FIG. 4 shows an example of a schematic pulse sequence diagram as can be used in an inventive method, in particular if all navigator signals are to be recorded after only one RF excitation pulse, in other words, for example, for a single-shot method.

The same reference numerals again identify the same elements of the pulse sequence as in FIGS. 1 and 3. For the sake of clarity, predominantly the differences in the embodiment shown in FIG. 4 from the embodiment shown in FIG. 3 will therefore be discussed.

As already mentioned, the pulse sequence shown in FIG. 4 manages with only one repetition, in order to be able to record all navigator signals for a determination of slice-specific correction data. However, for this, it is no longer just three, but per polarity and simultaneously measured subvolume, one navigator signal each plus another navigator signal, in other words an odd number of navigator signals, that are generated and recorded, extended by a bipolar readout gradient corresponding to the increased number of navigator signals to be recorded, but otherwise corresponding to the readout gradients in the navigator blocks NB of FIG. 3. In the illustrated case of two slices to be recorded simultaneously (N=2) therefore: 2*N+1=2*2+1=5 navigator signals N1, N2, N3, N4 and N5.

The navigator signals N1, N2, N3, N4 and N5 are loaded by gradient blips in the slice selection direction with the, here, two different phases, which are also impressed on the echo signals generated in the following EPI sequence, in such a way that at least two navigator signals with the same phase are loaded. In the illustrated "blip pattern" in the slice encoding direction, the first navigator signal N1, the second navigator signal N2 and the fifth navigator signal N5 are loaded with a first phase, and the remaining navigator signals N3 and N4 with a second phase. Other "blip patterns" are also conceivable. The navigator signals with an odd number, in other words N1, N3 and N5, each have the same polarity, here negative polarity. The navigator signals with an even number, in other words here N2 and N4, also have the same polarity and, more precisely, the opposite polarity to the navigator signals with an odd number.

Of the recorded navigator signals N1, N2, N3, N4 and N5 two can be selected, which were recorded by switching one readout gradient each of the same polarity to calculate an interpolated navigator signal. It is expedient to determine an interpolated navigator signal from the first and the last-recorded navigator signal respectively, because in this way a high symmetry of the recorded and interpolated navigator signals is inherently generated, which advantageously influences the stability of the correction data that can be determined from the navigator signals since this can in each case be considered to be recorded at the same echo time. The procedure can be the same as described in the already cited U.S. Pat. No. 6,043,651.

In the example shown, an interpolated navigator signal N3' can be determined in this way, for example from the navigator signals N1 and N5, which corresponds to the echo time of the recorded navigator signal N3. Because the navigator signals N1 and N5 were loaded with the first phase, the navigator signal N3' interpolated therefrom should also be assigned to the first phase, whereas the recorded navigator signal N3 was loaded with the second phase.

Therefore, for each phase to be impressed, one pair each of symmetrically arranged navigator signals with an odd number is obtained, here N3 and N3', and one pair each of symmetrically arranged navigator signals with an even number, here N2 and N4. By way of a Fourier transform in each case of these thus-formed pairs in the kz direction, these pairs can be separated into slice-specific pairs of navigator signals, from which correction data can be determined, for example, as in U.S. Pat. No. 6,043,651 mentioned above, it is possible to determine from the signals designated with $S2^-$ and $S2^+$ there, the linear phase response for each slice from the thus-obtained pairs of slice-specific navigator signals. A volume-specific DORK drift correction is already possible here with the still collapsed navigator signals. If a DORK correction should also be carried out subvolume-specifically, either the pulse sequence can be repeated with different "blip patterns" in the slice encoding direction, as described above with reference to FIG. 3, in order to be able to compare an evolution of the navigator signals, recorded with a first polarity, with an evolution of the navigator signals recorded with the other polarity, over successive recordings of navigator signals.

This approach can also be applied analogously to measurement techniques for the simultaneous measurement of more than two slices. For example, in the case of measurement data simultaneously recorded from three slices and therefore three different phases to be impressed, 2*N+1=2*3+1=7 navigator signals can in turn be recorded, with in each case the same phase being impressed on at least two of the navigator signals, and the polarity of the readout gradients changing as usual from navigator signal to subsequent navigator signal.

Here, too, from the recorded navigator signals two can be selected, which were recorded by switching one readout gradient each of the same polarity, in order to calculate an interpolated navigator signal. If an interpolated navigator signal N4' is determined from the recorded navigator signals N1 and N7, for each phase to be impressed, one triplet each of symmetrically arranged navigator signals with an odd number, for example N1 (or N4'), N3 and N5, and one pair each of symmetrically arranged navigator signals with an even number, for example N2, N4 and N6, can be formed. By way of a respective Fourier transform of these thus-formed triplets in the kz direction, these triplets can be separated into slice-specific triplets of navigator signals, from which, for example again analogously to the method described in U.S. Pat. No. 6,043,651, correction data can be determined.

Even with recording of all navigator signals after only one RF excitation pulse, a subvolume-specific DORK correction can be possible by recording a further navigator signal, in other words a total of 3*N navigator signals, in a navigator block NB. If, for example in front of the navigator signal N1 in FIG. 4, another navigator signal N0 (not shown) is generated and recorded by impressing the second phase, then pairs as described above can also be formed from the navigator signals N0 and N1 as well as from the navigator signals N4 and N5, which in each case consist of a navigator signal of the first polarity, on which the first phase was impressed, and a navigator signal of the second polarity, on which the second phase was impressed. After a Fourier transform in the kz direction of these pairs, slice-specific navigator data is therefore obtained as can be used for the DORK method.

Figure 5:
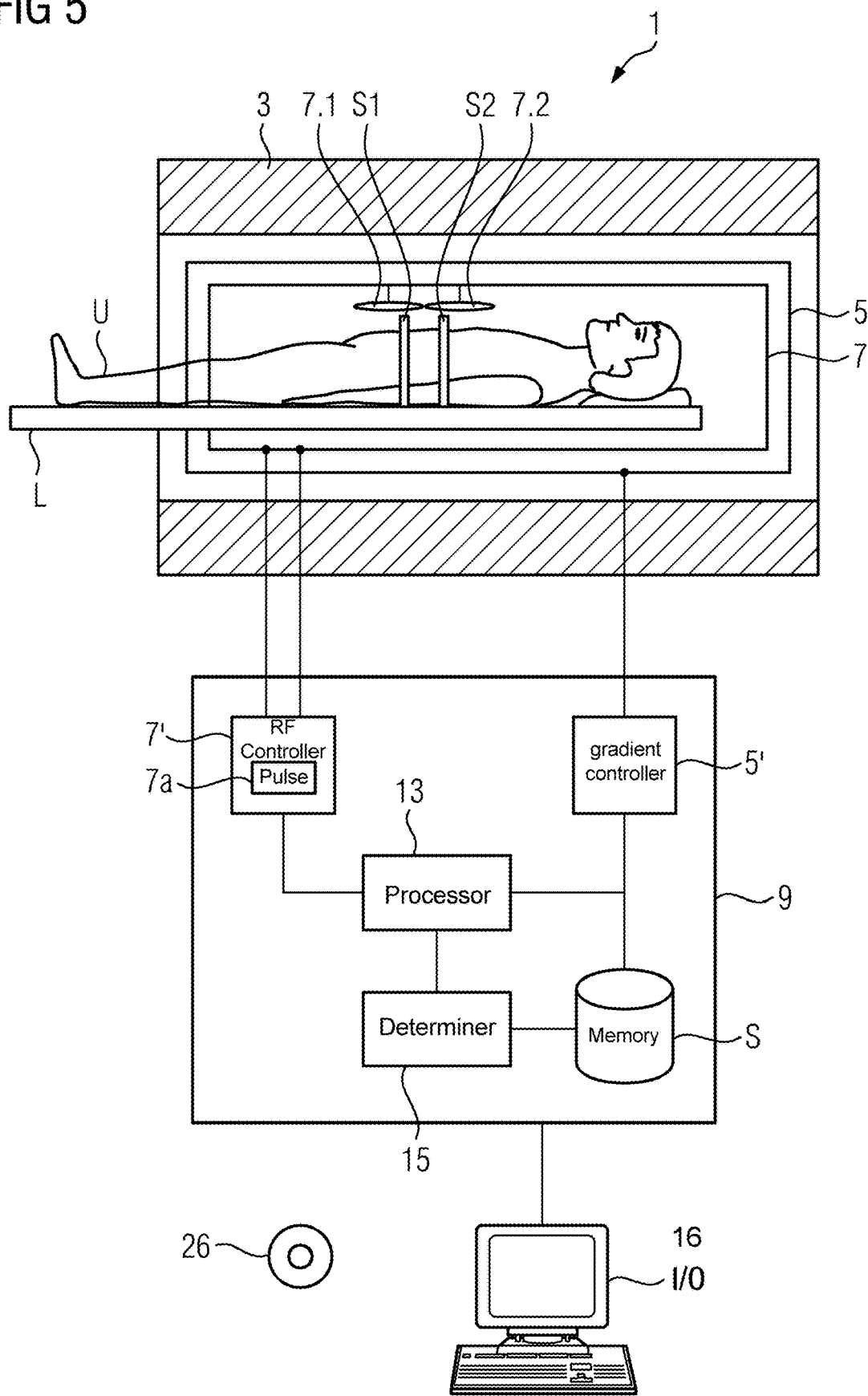
FIG. 5 is a magnetic resonance system according to an exemplary embodiment of the present disclosure.

FIG. 5 schematically illustrates a magnetic resonance system 1 according to an exemplary embodiment. This includes a magnetic unit 3 configured to generate the base magnetic field, a gradient unit 5 configured to generate the gradient fields, a radio frequency unit 7 configured to irradiate and receive radio frequency (RF) signals and a control device 9 configured to perform the method according to exemplary aspects described herein. In an exemplary embodiment, the control device 9 can be referred to as controller 9 or main controller 9.

FIG. 5 shows these sub-units of the magnetic resonance system 1 schematically. In an exemplary embodiment, the radio frequency unit 7 includes a plurality of sub-units, in particular at least two coils such as the schematically shown coils 7.1 and 7.2, which can be designed either only for sending radio frequency signals or only for receiving the triggered radio frequency signals or for both.

For the examination of an examination object U, for example, of a patient or also of a phantom, the latter can be introduced on a couch L into the magnetic resonance system 1 in its measuring volume. Slices S1 and S2 are examples of two different slices S1 and S2 of the examination object, which can be simultaneously measured when recording MR signals.

In an exemplary embodiment, the control device 9 is configured to control the magnetic resonance system and can in particular control the gradient unit 5 by a gradient controller 5' and the radio frequency unit 7 by a radio frequency transceiving controller 7'. The radio frequency unit 7 can include a plurality of channels on which signals can be transmitted or received. In an exemplary embodiment, the control device 9 (and/or one or more of its components) includes processor circuitry that is configured to perform one or more operations and/or functions of the control device 9, including controlling the magnetic resonance system 1 to obtain scan data and/or controlling the operations of one or more components of the control device 9.

The radio frequency unit 7 together with its radio frequency (RF) transceiving controller 7' is responsible for the generation and irradiation (transmission) of a radio frequency exchange field for the manipulation of the spins in a region for manipulation (in particular in different slices S1 and S2) of the examination object U. The center frequency of the radio frequency exchange field, also referred to as the B1 field, should be close to the resonance frequency of the spins to be manipulated. Currents controlled by means of the radio frequency transceiving controller 7' are applied to the RF coils for the generation of the B1 field in the radio frequency (RF) unit 7. In an exemplary embodiment, the RF controller 7' includes processor circuitry that is configured to control currents applied to the RF-coils in the RF unit 7.

In an exemplary embodiment, the control device 9 includes a phase determiner 15, in particular for the determination of phases to be inventively additionally impressed. In an exemplary embodiment, the determiner 15 includes processor circuitry that is configured to determine phases.

An processor 13 encompassed by the control device 9 is designed to perform all the necessary calculation operations for the necessary measurements and determinations. Intermediate results and results required or determined in the process for this can be stored in a storage unit S of the control device 9. The units shown should not necessarily be taken to mean physically separate units, but merely represent a breakdown into units of meaning, which, however, can also be implemented, for example, in fewer units or even in just a single physical unit. In an exemplary embodiment, the processor 13 includes processor circuitry that is configured to perform one or more computing operations required for the necessary scans and determinations Control commands can be routed via an input/output device I/O 16 of the magnetic resonance system 1, for example by a user, to the magnetic resonance system and/or results of the control device 9, such as image data, can be displayed. In an exemplary embodiment, the I/O device 16 is a computer, mobile communication device (e.g. smartphone, tablet), or another stationary or mobile computing device as would be understood by one of ordinary skill in the relevant arts.

A method described herein can also be in the form of a computer program product, which includes a program and implements the described method on a control device 9 when it is run on the control device 9. Similarly, an electronically readable memory storage medium 26 can be present, having electronically readable information stored thereon, which includes at least one such computer program product described above and is configured in such a way that it carries out the described method when the memory storage medium 26 is used in a control device 9 of a magnetic resonance system 1. In exemplary embodiment, the memory storage medium 26 is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM).

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. A circuit includes an analog circuit, a digital circuit, state machine logic, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A method for generating measurement data of an examination object using magnet resonance (MR) imaging, comprising:
   after a radio frequency (RF) excitation pulse, generating a train of a plurality of echo signals in two or more different subvolumes of the examination object;
   after the RF excitation pulse, switching gradients with changing polarity for successive echo signals of the plurality of echo signals to record the train of the plurality of echo signals, wherein one each of a plurality of different phases is impressed on the successive echo signals of the plurality of echo signals, recorded echo signals of the at least two subvolumes being acquired as MR raw data in a raw data set, wherein:
   after the RF excitation pulse, recording at least three navigator signals in an absence of gradients in a phase encoding direction, a total of at least one navigator signal per possible polarity and per different phase being impressed;
   determining subvolume-specific correction data based on the recorded at least three navigator signals, wherein the determination of the subvolume-specific correction data includes interpolating two of the at least three recorded navigator signals to determine an interpolated navigator signal, the interpolated two of the at least three recorded navigator signals being recorded by switching one readout gradient of a same polarity, the same polarity continuing to be assigned to the interpolated navigator signal; and
   reconstructing image data from the acquired MR raw data based on the determined subvolume-specific correction data to correct phase error shifts in the MR raw data.

2. A magnetic resonance system comprising:
   a MR scanner configured to irradiate one or more RF excitation pulses; and
   a controller that is configured to:
      after a RF excitation pulse, generates a train of a plurality of echo signals in two or more different subvolumes of the examination object;
      after the RF excitation pulse, switch gradients with changing polarity for successive echo signals of the plurality of echo signals to record the train of the plurality of echo signals, wherein one each of a plurality of different phases is impressed on the successive echo signals of the plurality of echo signals, recorded echo signals of the at least two subvolumes being acquired as MR raw data in a raw data set, wherein:
      after the RF excitation pulse, record at least three navigator signals in an absence of gradients in a phase encoding direction, a total of at least one navigator signal per possible polarity and per different phase being impressed;
      determine subvolume-specific correction data based on the recorded at least three navigator signals, wherein the determination of the subvolume-specific correction data includes interpolating two of the at least three recorded navigator signals to determine an interpolated navigator signal, the interpolated two of the at least three recorded navigator signals being recorded by switching one readout gradient of a same polarity, the same polarity continuing to be assigned to the interpolated navigator signal; and
      reconstruct image data from the acquired MR raw data based on the determined subvolume-specific correction data to correct phase error shifts in the MR raw data.

3. The method as claimed in claim 1, wherein the recording of the at least three navigator signals includes switching gradients with changing polarity for the successive echo signals, and a polarity having an associated readout gradient being assigned to each of the at least three navigator signals.

4. The method as claimed in claim 1, wherein the at least three navigator signals are generated and recorded after the RF excitation pulse and before the generation of the plurality of echo signals.

5. The method as claimed claim 1, wherein one each of the different phases impressed on the successive echo signals is impressed on the at least three navigator signals.

6. The method as claimed in claim 5, wherein each of the different phases impressed on the successive echo signals is impressed on at least two of the at least three navigator signals.

7. The method as claimed in claim 1, wherein after the RF excitation pulse, an odd number of navigator signals is recorded.

8. The method as claimed in claim 1, wherein all of the at least three navigator signals is recorded after the RF excitation pulse.

9. The method as claimed in claim 8, wherein a number of recorded navigator signals of the at least three navigator signals corresponds to twice a number of simultaneously recorded subvolumes, of the two or more different subvolumes of the examination object, plus one.

10. The method as claimed in claim 5, wherein irradiation of the RF excitation pulse and the switching of gradients for the generation and reading out of navigator signals and the echo signals is repeated, the phases impressed on the respective navigator signals differ from the phases impressed in a preceding repetition on the navigator signals corresponding to the respective navigator signals.

11. The method as claimed in claim 5, wherein irradiation of the RF excitation pulse and the switching of gradients for the generation and reading out of navigator signals and echo signals is repeated, a different one of the phases being impressed on the navigator signals in each repetition.

12. The method as claimed in claim 10, wherein a different one of the phases is impressed on the navigator signals in each repetition.

13. The method as claimed in claim 1, wherein the determination of the subvolume-specific correction data in each case comprises separating navigator signals, of the at least three navigator signals, assigned to an identical polarity in to subvolume-specific navigator data.

14. A computer program product having a computer program which is directly loadable into a memory of a controller of the MR scanner, when executed by the controller, causes the magnetic resonance system to perform the method of claim 1.

15. A non-transitory computer-readable storage medium with an executable computer program stored thereon, that when executed, instructs a processor to perform the method of claim 1.

16. The magnetic resonance system of claim 2, wherein the MR scanner comprises a magnetic unit, a gradient unit, and a radio frequency unit, and the controller comprises a radio frequency transceiving controller with a multi-band RF pulse unit.

17. The method as claimed in claim 1, wherein the different phases are impressed on the successive echo signals in a slice encoding direction.

* * * * *